US009046590B2

(12) United States Patent
Umeda

(10) Patent No.: US 9,046,590 B2
(45) Date of Patent: Jun. 2, 2015

(54) MAGNETIC RESONANCE IMAGING APPARATUS PHASE CORRECTION USING ONE OR MORE PRESCANS WITH IDENTICAL READOUT AND SLICE GRADIENTS

(75) Inventor: Masaaki Umeda, Sakura (JP)

(73) Assignees: KABUSHIKI KAISHA TOSHIBA, Minato-Ku, Tokyo (JP); TOSHIBA MEDICAL SYSTEMS CORPORATION, Otawara-Shi, Tochigi (JP)

(*) Notice: Subject to any disclaimer, the term of this patent is extended or adjusted under 35 U.S.C. 154(b) by 684 days.

(21) Appl. No.: 13/434,935

(22) Filed: Mar. 30, 2012

(65) Prior Publication Data
US 2012/0249143 A1 Oct. 4, 2012

(30) Foreign Application Priority Data

Mar. 31, 2011 (JP) ................................. 2011-080111
Mar. 1, 2012 (JP) ................................. 2012-045281

(51) Int. Cl.
G01R 33/565 (2006.01)
G01R 33/561 (2006.01)
(52) U.S. Cl.
CPC ...... G01R 33/56518 (2013.01); G01R 33/5617 (2013.01); G01R 33/56554 (2013.01)
(58) Field of Classification Search
USPC .......................... 324/300–322; 600/407–435; 382/128–131
See application file for complete search history.

(56) References Cited

U.S. PATENT DOCUMENTS

| 4,870,361 A * | 9/1989 | In Den Kleef et al. ........ 324/309 |
| 4,982,161 A * | 1/1991 | Twieg ............................ 324/309 |
| 5,262,725 A * | 11/1993 | Cuppen et al. ................. 324/312 |
| 5,347,218 A * | 9/1994 | Van Yperen ................... 324/309 |
| 5,450,010 A * | 9/1995 | Van Der Meulen et al. .. 324/309 |
| 5,493,224 A * | 2/1996 | Shiono et al. .................. 324/309 |
| 5,647,362 A * | 7/1997 | Fuderer et al. ................. 600/410 |
| 5,729,139 A * | 3/1998 | Goto ............................. 324/309 |
| 5,818,229 A * | 10/1998 | Kanazawa ..................... 324/309 |
| 5,928,146 A * | 7/1999 | Itagaki et al. .................. 600/410 |
| 6,150,815 A * | 11/2000 | Janzen et al. .................. 324/309 |
| 6,160,397 A * | 12/2000 | Washburn et al. ............. 324/309 |
| 6,218,834 B1 * | 4/2001 | Goto ............................. 324/307 |
| 6,285,900 B1 * | 9/2001 | Stuber et al. .................. 600/410 |

(Continued)

OTHER PUBLICATIONS

Action issued Oct. 22, 2014 in CN Patent Application No. 201210091160.2.

Primary Examiner — Melissa Koval
Assistant Examiner — Tiffany Fetzner
(74) Attorney, Agent, or Firm — Nixon & Vanderhye P.C.

(57) ABSTRACT

In a magnetic resonance imaging apparatus according to one embodiment, an executing unit executes a first pre-scan and a second pre-scan, each being a pre-scan in which readout gradient magnetic fields and slice direction gradient magnetic fields are applied in an identical manner to a pulse sequence for main-scanning and in which phase encode gradient magnetic fields are applied in an identical manner to the pulse sequence for main-scanning up to just before echoes used in calculating a correction amount, and each having different predetermined imaging parameters; a calculating unit calculates, as a correction amount, an amount of phase shifting by referring to phase differences present in a plurality of echo signals that are collected during the first pre-scan and the second pre-scan; and a correcting unit corrects the pulse sequence for main-scanning based on the correction amount calculated by the calculating unit.

20 Claims, 12 Drawing Sheets

EXEMPLARY MRI MAIN SCAN PULSE SEQUENCE, 1ST EMBODIMENT

(56) References Cited

U.S. PATENT DOCUMENTS

| | | | |
|---|---|---|---|
| 6,331,777 B1* | 12/2001 | Van Den Brink et al. | 324/312 |
| 6,369,568 B1* | 4/2002 | Ma et al. | 324/309 |
| 6,424,152 B1* | 7/2002 | Prins et al. | 324/307 |
| 6,470,203 B2* | 10/2002 | Miyamoto | 600/410 |
| 6,617,850 B2* | 9/2003 | Welch et al. | 324/309 |
| 6,781,375 B2* | 8/2004 | Miyazaki et al. | 324/314 |
| 7,141,970 B2* | 11/2006 | Miyawaki et al. | 324/307 |
| 7,622,922 B2* | 11/2009 | Dannels | 324/309 |
| 7,894,891 B2* | 2/2011 | Song et al. | 600/546 |
| 7,898,254 B2* | 3/2011 | Feinberg et al. | 324/309 |
| 8,115,485 B1* | 2/2012 | Maier et al. | 324/318 |
| 8,154,294 B2* | 4/2012 | Takizawa et al. | 324/318 |
| 8,159,221 B2* | 4/2012 | Yui | 324/307 |
| 8,473,046 B2* | 6/2013 | Song et al. | 600/546 |
| 8,587,305 B2* | 11/2013 | Madhuranthakam et al. | 324/307 |
| 8,587,310 B2* | 11/2013 | Taniguchi et al. | 324/309 |
| 8,594,766 B2* | 11/2013 | Takizawa et al. | 600/415 |
| 8,624,595 B2* | 1/2014 | Umeda | 324/307 |
| 2001/0017544 A1* | 8/2001 | Miyamoto | 324/314 |
| 2003/0102864 A1* | 6/2003 | Welch et al. | 324/307 |
| 2005/0218894 A1* | 10/2005 | Miyawaki et al. | 324/309 |
| 2007/0238969 A1* | 10/2007 | Song et al. | 600/410 |
| 2008/0265885 A1* | 10/2008 | Dannels | 324/312 |
| 2009/0134871 A1* | 5/2009 | Yui | 324/309 |
| 2009/0177078 A1* | 7/2009 | Takizawa et al. | 600/415 |
| 2009/0212773 A1* | 8/2009 | Feinberg et al. | 324/309 |
| 2009/0300843 A1* | 12/2009 | Matsushita et al. | 5/601 |
| 2010/0164495 A1* | 7/2010 | Takizawa et al. | 324/309 |
| 2011/0105886 A1* | 5/2011 | Song et al. | 600/410 |
| 2011/0112393 A1* | 5/2011 | Taniguchi et al. | 600/410 |
| 2011/0245655 A1* | 10/2011 | Abe et al. | 600/410 |
| 2011/0291653 A1* | 12/2011 | Umeda | 324/309 |
| 2012/0249143 A1* | 10/2012 | Umeda | 324/309 |
| 2012/0313641 A1* | 12/2012 | Labadie et al. | 324/309 |
| 2013/0057280 A1* | 3/2013 | Feiweier | 324/309 |
| 2013/0169275 A1* | 7/2013 | Li et al. | 324/309 |
| 2013/0293231 A1* | 11/2013 | Hirai | 324/309 |
| 2013/0314090 A1* | 11/2013 | Taniguchi et al. | 324/322 |
| 2014/0084916 A1* | 3/2014 | Greiser et al. | 324/306 |
| 2014/0111203 A1* | 4/2014 | Zhou | 324/309 |

* cited by examiner

CONVENTIONAL PRE-SCAN IMAGE

PRE-SCAN IMAGE ACCORDING TO THE 1$^{ST}$ EMBODIMENT

ECHO SIGNALS COLLECTED IN 3RD EMBODIMENT

2ND PRE-SCAN 2ND PULSE SEQUENCE, 4TH EMBODIMENT

MAGNETIC RESONANCE IMAGING APPARATUS PHASE CORRECTION USING ONE OR MORE PRESCANS WITH IDENTICAL READOUT AND SLICE GRADIENTS

CROSS-REFERENCE TO RELATED APPLICATIONS

This application is based upon and claims the benefit of priority from Japanese Patent Application No. 2011-080111, filed on Mar. 31, 2011; and Japanese Patent Application No. 2012-045281, filed on Mar. 1, 2012, the entire contents of all of which are incorporated herein by reference.

FIELD

Embodiments described herein relate generally to a magnetic resonance imaging apparatus.

BACKGROUND

Typically, as an imaging method related to a magnetic resonance imaging apparatus, the fast spin echo (FSE) method is known. The FSE method is an imaging method in which firstly a flip pulse is applied to a person being tested and then a plurality of flop pulses is sequentially applied the person being tested so as to collect a plurality of echo signals called an echo train. Herein, a flip pulse is a radio frequency (RF) pulse used for excitation of the nucleus spin inside the person being tested; and flop pulses are RF pulses used for refocusing the phase of the nucleus.

In this FSE method, since a plurality of RF pulses is applied, the generation of spin echoes is accompanied by the generation of stimulated echoes. Because of the stimulated echoes, sometimes phase shifts occur in the echo signals that are collected. Such phase shifts cause degradation in the image quality in the form of unevenness in the photographic sensitivity, signal deterioration, or ghost image formation.

In order to prevent such degradation in the image quality; generally, a main-scan is preceded by a pre-scan so as to measure the phase differences occurring in the echo signals. Based on the phase differences measured during the pre-scan, the pulse sequence for main-scanning is corrected. In that case, for example, during a pre-scan, a pulse sequence for cancelling the stimulated echoes is implemented and only the spin echoes are collected. Then, of the spin echoes collected during the pre-scan, the first echo signal and the second echo signal are subjected to Fourier conversion in the readout direction, and a zero-dimensional phase shift and a one-dimensional phase shift between the first echo signal and the second echo signal are calculated. Subsequently, based on the zero-dimensional phase shift and the one-dimensional phase shift, a correction amount is calculated for correcting the phase shifts in the readout direction and the slice selection direction, and the pulse sequence for main-scanning is modified according to the calculated correction amount.

However, in the technology described above, it is not possible to correct the phase shifts that occur in the phase encode direction due to the effect of the eddy currents generated by phase encode gradient magnetic fields. Such phase shifts sometimes cause degradation in the image quality.

DETAILED DESCRIPTION

According to one embodiment, a magnetic resonance imaging apparatus includes an executing unit, a calculating unit, and a correcting unit. The executing unit executes a first pre-scan and a second pre-scan, each being a pre-scan in which readout gradient magnetic fields and slice direction gradient magnetic fields are applied in an identical manner to a pulse sequence for main-scanning and in which phase encode gradient magnetic fields are applied in an identical manner to the pulse sequence for main-scanning up to just before echoes used in calculating a correction amount, and each having different predetermined imaging parameters. The calculating unit calculates, as a correction amount, an amount of phase shifting by referring to phase differences present in a plurality of echo signals that are collected during the first pre-scan and the second pre-scan. The correcting unit corrects the pulse sequence for main-scanning based on the correction amount calculated by the calculating unit.

Exemplary embodiments of a magnetic resonance imaging apparatus are described in detail below with reference to the accompanying drawings. In the following embodiments, the magnetic resonance image apparatus is referred to as MRI apparatus.

First Embodiment

Figure 1:
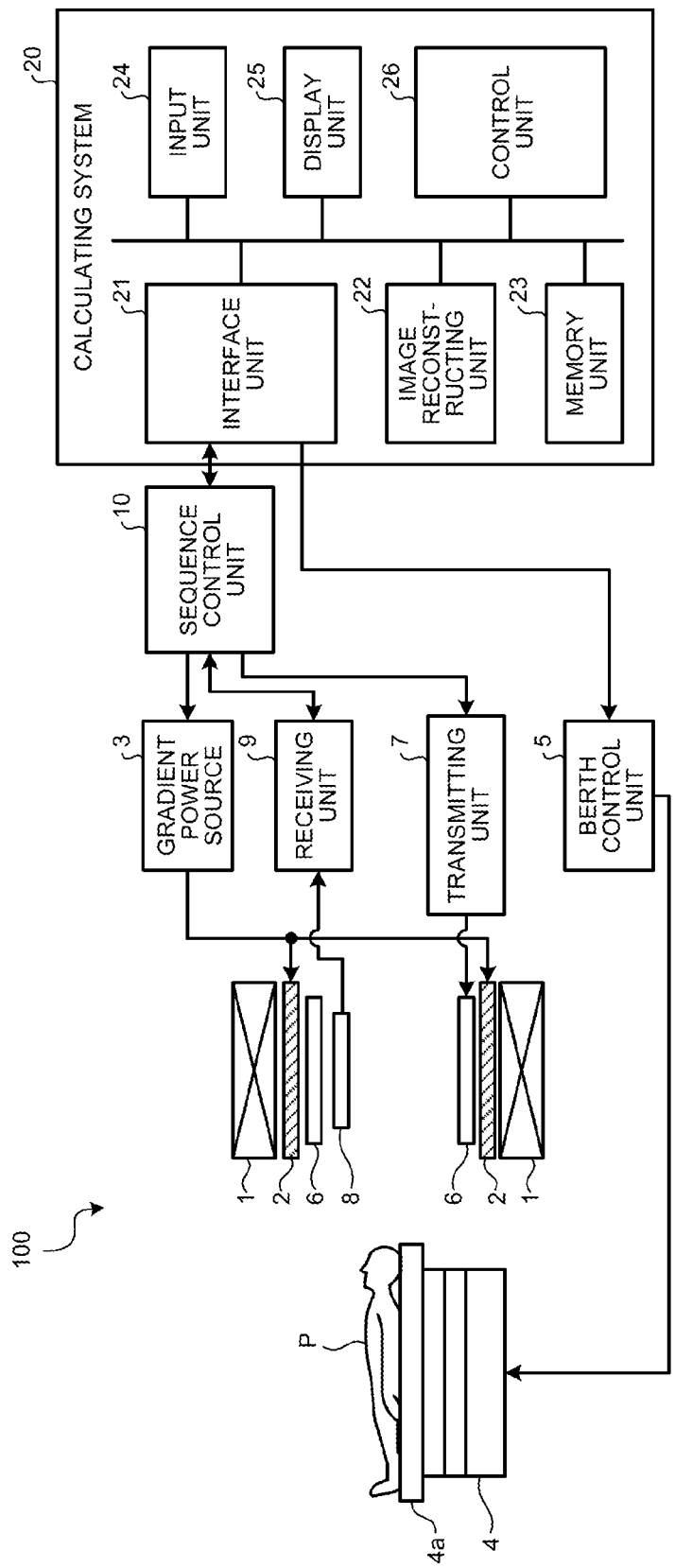
FIG. 1 is a diagram illustrating a configuration of an MRI apparatus according to a first embodiment.

FIG. 1 is a diagram illustrating a configuration of the MRI apparatus according to a first embodiment. As illustrated in FIG. 1, an MRI apparatus 100 includes a magnetostatic magnet 1, a gradient coil 2, a gradient power source 3, a couch 4, a couch control unit 5, a transmitter RF coil 6, a transmitting unit 7, a receiver RF coil 8, a receiving unit 9, a sequence control unit 10, and a calculating system 20.

The magnetostatic magnet 1 is a hollow cylindrical magnet and forms a uniform magnetostatic field in the internal space thereof. As the magnetostatic magnet 1, for example, a permanent magnet or a superconductive magnet is used.

The gradient coil 2 is a hollow cylindrical coil disposed on the inside of the magnetostatic magnet 1. The gradient coil 2 is formed as a combination of three coils corresponding to the mutually-orthogonal X, Y, and Z axes. The three coils independently receive a current supply from the gradient power source 3 (described later) and generate gradient magnetic fields having varying magnetic field intensities along the X, Y, and Z axes. The gradient power source 3 supplies current to the gradient coil 2.

Herein, the gradient magnetic fields generated along the X, Y, and Z axes by the gradient coil 2 correspond to, for example, a slice selection gradient magnetic field Gs, a phase encode gradient magnetic field Ge, and a readout gradient magnetic field Gr. The slice selection gradient magnetic field Gs is used in arbitrarily deciding the imaging cross-section. The phase encode gradient magnetic field Ge is used in changing the phases of magnetic resonance signals according to spatial positions. The readout gradient magnetic field Gr is used in changing the frequencies of magnetic resonance signals according to spatial positions.

The couch 4 has a couchtop 4a on which a person being tested P is asked to lie. Under the control of a couch control unit 5 (described later), the couchtop 4a on which the person being tested P is lying is moved inside the hollow cavity (imaging opening) of the gradient coil 2. Usually, the orientation of the couch 4 is such that the longitudinal direction thereof is parallel to the magnetostatic magnet 1. The couch control unit 5 operates under the control of a control unit 26 and controls the couch 4. More particularly, the couch control unit 5 drives the couch 4 and moves the couchtop 4a in the longitudinal direction and in the vertical direction.

The transmitter RF coil 6 is disposed on the inside of the gradient coil 2, receives radiofrequency pulses from the transmitting unit 7, and generates high-frequency magnetic fields. The transmitting unit 7 transmits radiofrequency pulses corresponding to the Larmor frequency to the transmitter RF coil 6. The receiver RF coil 8 is disposed on the inside of the gradient coil 2 and receives magnetic resonance signals radiated from the person being tested P due to the effect of the high-frequency magnetic fields mentioned above. Upon receiving the magnetic resonance signals, the receiver RF coil 8 outputs those magnetic resonance signals to the receiving unit 9.

Based on the magnetic resonance signals output by the receiver RF coil 8, the receiving unit 9 generates magnetic resonance (MR) signal data. More particularly, the receiving unit 9 generates MR signal data by performing digital conversion of the magnetic resonance signals output by the receiver RF coil 8. In the MR signal data, information regarding spatial frequencies in the phase encode direction, the readout direction, and the slice encode direction is disposed in the k-space by the slice selection gradient magnetic field Gs, the phase encode gradient magnetic field Ge, and the readout gradient magnetic field Gr. Once the MR signal data is generated, the receiving unit 9 sends that MR signal data to the sequence control unit 10.

Based on sequence execution data sent by the calculating system 20, the sequence control unit 10 scans the person being tested P by means of driving the gradient power source 3, the transmitting unit 7, and the receiving unit 9. Herein, the sequence execution data points to the information that defines the pulse sequence indicating the sequence for scanning the person being tested P. More particularly, the sequence execution data includes the strength or the timing of the power supply from the gradient power source 3 to the gradient coil 2, the intensity or the timing of transmission of the RF signals from the transmitting unit 7 to the transmitter RF coil 6, and the timing of detection of magnetic resonance signals by the receiving unit 9. Moreover, once the gradient power source 3, the transmitting unit 7, and the receiving unit 9 are driven; when the MR signal data is sent by the receiving unit 9, the sequence control unit 10 transfers that MR signal data to the calculating system 20.

The calculating system 20 performs the overall control of the MRI apparatus 100. For example, the calculating system 20 drives all constituent elements of the MRI apparatus 100, performs scanning of the person being tested P, and performs image reconstruction. The calculating system 20 includes an interface unit 21, an image reconstructing unit 22, a memory unit 23, an input unit 24, a display unit 25, and the control unit 26.

The interface unit 21 controls the input-output of various signals communicated with the sequence control unit 10. For example, the interface unit 21 sends sequence execution data to the sequence control unit 10 and receives MR signal data from the sequence control unit 10. Upon receiving the MR signal data, the interface unit 21 stores each set of MR signal data in a corresponding manner to each person being tested P in the memory unit 23.

With respect to each set of MR signal data stored in the memory unit 23, the image reconstructing unit 22 performs post-processing, that is, reconstruction processing such as Fourier conversion, and generates spectrum data or image data of the desired nucleus spin inside the corresponding person being tested P.

The memory unit 23 stores therein a variety of data or various computer programs that are required for the operations performed by the control unit 26 (described later). For example, with respect to each person being tested P, the memory unit 23 stores therein the MR signal data received by the interface unit 21 and the spectrum data or the image data generated by the image reconstructing unit 22.

The input unit 24 receives various instructions or information input by the operator. As the input unit 24; it is possible to appropriately use a pointing device such as a mouse or a trackball, a selection device such as a mode switch, or an input device such as a keyboard.

The display unit 25 operates under the control of the control unit 26 and displays a variety of information such as the spectrum data or the image data. As the display unit 25, a display device such as a liquid crystal display device can be used.

The control unit 26 includes a central processing unit (CPU) and a memory, and comprehensively controls the MRI apparatus 100. For example, the control unit 26 controls the scanning operation by generating a variety of sequence execution data according to the imaging conditions, which are input by the operator via the input unit 24, and sending that sequence execution data to the sequence control unit 10. Moreover, when the sequence control unit 10 sends MR signal data as a scan result, the control unit 26 controls the image reconstructing unit 22 to perform image reconstruction based on that MR signal data.

Thus, the MRI apparatus 100 according to the first embodiment has the configuration described above. With such a configuration, the MRI apparatus 100 performs pre-scanning. Herein, during a pre-scan, readout gradient magnetic fields and slice direction gradient magnetic fields are applied in an identical manner to the pulse sequence for main-scanning, and phase encode gradient magnetic fields are applied in an identical manner to the pulse sequence for main-scanning up to just before the echoes used in calculating the correction amount. Then, as the correction amount, the MRI apparatus 100 calculates the amount of phase shifting by referring to the phase differences present in a plurality of echo signals obtained during the pre-scan. Moreover, the MRI apparatus 100 corrects the pulse sequence for main-scanning based on the correction amount calculated by a correction amount calculating unit 26c (described later).

Thus, the MRI apparatus 100 according to the first embodiment performs a pre-scan in which phase encode gradient magnetic fields are applied and, based on the phase shifts among the echo signals obtained during the pre-scan, calculates a correction amount regarding the pulse sequence for main-scanning. Hence, according to the first embodiment, it becomes possible to prevent image deterioration that may occur due to the phase shifts present in the readout direction and the slice direction as well as due to zero-dimensional phase shifts occurring due to the phase encode gradient magnetic fields. Given below is the detailed explanation of the functions of the MRI apparatus 100 according to the first embodiment.

Figure 2:
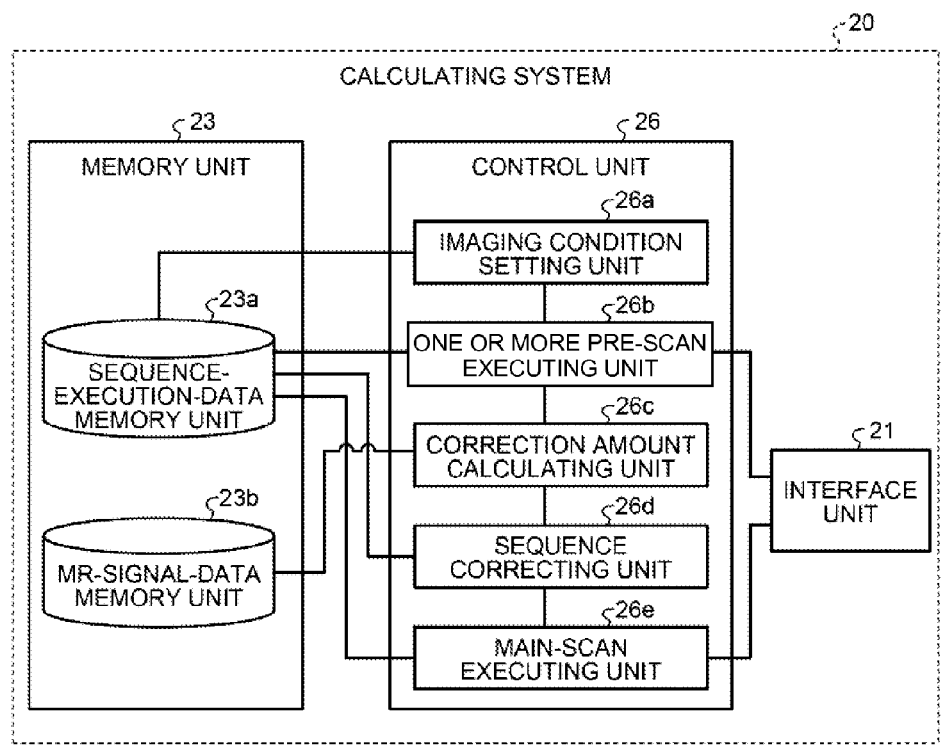
FIG. 2 is a functional block diagram illustrating a detailed configuration of a calculating system illustrated in FIG. 1.

FIG. 2 is a functional block diagram illustrating a detailed configuration of the calculating system 20 illustrated in FIG. 1. In FIG. 2, from among the functions of the calculating system 20; the interface unit 21, the memory unit 23, and the control unit 26 are illustrated.

The memory unit 23 includes a sequence-execution-data memory unit 23a and an MR-signal-data memory unit 23b. The sequence-execution-data memory unit 23a stores therein sequence execution data that is generated by an imaging condition setting unit 26a (described later). The MR-signal-data memory unit 23b stores therein MR signal data received by the interface unit 21.

The control unit 26 includes the imaging condition setting unit 26a, a pre-scan executing unit 26b, the correction amount calculating unit 26c, a sequence correcting unit 26d, and a main-scan executing unit 26e.

The imaging condition setting unit 26a generates, based on imaging conditions input by the operator via the input unit 24, sequence execution data that defines the pulse sequence used in imaging. For example, when the operator inputs imaging conditions for the FSE method, the imaging condition setting unit 26a generates sequence execution data regarding the pulse sequence for main-scanning (described later) as well as regarding the pulse sequence for pre-scanning (described later).

Figure 3:
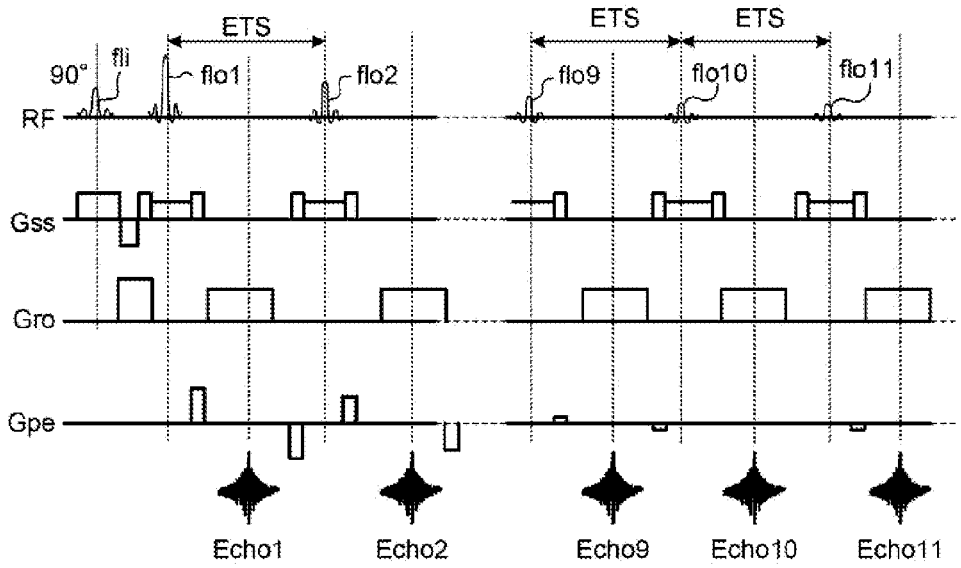
FIG. 3 is a diagram illustrating a pulse sequence for main-scanning according to the first embodiment.

FIG. 3 is a diagram illustrating a pulse sequence for main-scanning according to the first embodiment. In FIG. 3, "RF" represents the timings at which a flip pulse for excitation and flop pulses for refocusing are applied. "Gss" represents the timings of applying the slice selection gradient magnetic fields as well as the intensities of the slice selection gradient magnetic fields. "Gro" represents the timings of applying the readout gradient magnetic fields as well as the intensities of the readout gradient magnetic fields. "Gpe" represents the timings of applying the phase encode gradient magnetic fields as well as the intensities of the phase encode gradient magnetic fields. Meanwhile, in FIG. 3, the pulse sequence related to only a single slice selection is illustrated. Regarding the slice encode, diagrammatic illustration is not given. Moreover, "ETS (echo train spacing)" represents echo intervals.

As illustrated in FIG. 3, the pulse sequence for main-scanning is same as the pulse sequence for the common FSE method. As illustrated in FIG. 3, in the pulse sequence for main-scanning, after a flip pulse fli is applied, a plurality of flop pulses flo1, flo2, . . . , flo9, flo10, flo11, . . . is sequentially applied; and a plurality of echo signals Echo1, Echo2, . . . , Echo9, Echo10, Echo11, . . . is collected. The pulse sequence illustrated in FIG. 3 is an example of a case when the phase encode gradient magnetic field becomes zero at the echo signal Echo10 collected at the 10-th count.

Figure 4:
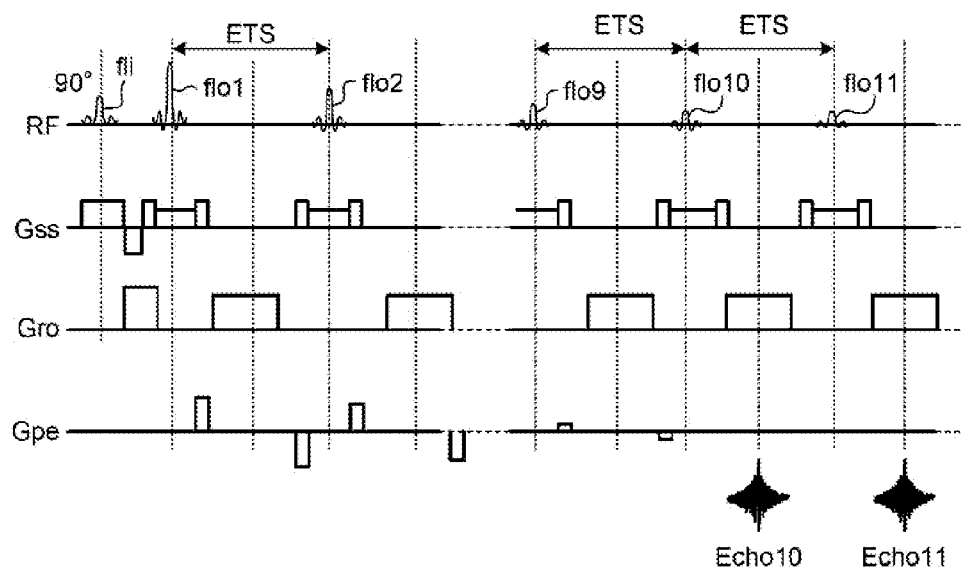
FIG. 4 is a diagram illustrating a pulse sequence for pre-scanning according to the first embodiment.

FIG. 4 is a diagram illustrating a pulse sequence for pre-scanning according to the first embodiment. In the pulse sequence for pre-scanning, in an identical manner to the pulse sequence for main-scanning illustrated in FIG. 3, the readout gradient magnetic fields and the slice direction gradient magnetic fields are applied, and the phase encode magnetic gradient fields are applied in an identical manner to the pulse sequence for main-scanning up to just before the echoes used in calculating the correction amount.

For example, as illustrated in FIG. 4, in the pulse sequence for pre-scanning, in an identical manner to the pulse sequence for main-scanning illustrated in FIG. 3, the readout gradient magnetic fields and the slice direction gradient magnetic fields are applied; and, of the phase encode magnetic gradient fields applied in the pulse sequence for main-scanning, at least a single phase encode magnetic gradient field is applied up to the echo in the vicinity of the k-space center. In other words, with reference to the pulse sequence for main-scanning, in the pulse sequence for pre-scanning, the phase encode gradient magnetic fields are applied up to the vicinity of the contrast TE and are not applied after the contrast TE. Meanwhile, in the example illustrated in FIG. 4, Echo10 corresponds to the K-space center.

For example, in the pulse sequence for pre-scanning, in an identical manner to the man-scan pulse sequence, the readout gradient magnetic fields and the slice selection gradient magnetic fields are applied; and, of a plurality of phase encodes used in the pulse sequence for main-scanning, the phase encode gradient magnetic field in the vicinity of the average intensity is applied.

Moreover, in the pre-scan sequence, the settings are such that the stimulated echoes get cancelled and only the spin echoes are collected. For example, it is possible to implement the method disclosed in U.S. Pat. No. 5,818,229. In that method, only spin echo components are extracted by adding the echo signals at the first shot, which are collected by varying the phases of the flop pulses for refocusing as π, π, π, π, . . . ; and the echo signals at the second shot, which are collected by varying the phases of the flop pulses for refocusing as π, −π, π, −π, . . . . Alternatively, only stimulated echo components are extracted by subtracting the echo signals at the second shot from the echo signals at the first shot. Then, the extracted stimulated echo components can be used in place of the spin echo components.

Herein, for example, in the case of a phase encode Matrix of 256 and echo collection of 19 echoes, it is necessary to have 256/19=13 shots. In that case, in the pulse sequence for pre-scanning, the setting is such that the phase encode gradient magnetic fields having the shot with the average phase encode gradient field intensity applied thereto (in the case of filling the phase encodes sequentially, the central shot (shot 7)) are applied.

Returning to the explanation with reference to FIG. 2, the pre-scan executing unit 26b executes the pulse sequence for pre-scanning.

More particularly, when the imaging condition setting unit 26a generates the sequence execution data for pre-scanning, the pre-scan executing unit 26b firstly reads the sequence execution data from the sequence-execution-data memory unit 23a. Then, the pre-scan executing unit 26b executes the pre-scan by sending the sequence execution data to the sequence control unit 10 via the interface unit 21. For example, the pre-scan executing unit 26b executes a pre-scan by sending the sequence execution data, which defines the pulse sequence illustrated in FIG. 4, to the sequence control unit 10.

The correction amount calculating unit 26c calculates, as the correction amount, the amount of phase shifting by referring to the phase differences present in a plurality of echo signals collected during the pre-scan. That is, from the phase differences present in a plurality of echo signals collected during the pre-scan, the correction amount calculating unit 26c calculates, as the correction amount, the amount of phase shifting (zero-dimensional and one-dimensional) occurring due to the readout gradient magnetic fields and the slice selection gradient magnetic fields, and the amount of zero-dimensional phase shifting occurring due to the phase encode gradient magnetic fields.

More particularly, after the pre-scan executing unit 26b performs the pre-scan, the correction amount calculating unit 26c reads, from the MR-signal-data memory unit 23b, the MR signal data related to the echo signals collected during the pre-scan. Then, the correction amount calculating unit 26c performs Fourier conversion on the MR signal data in the readout direction and calculates one-dimensional phase differences. Those one-dimensional phase differences represent the one-dimensional phase differences of the readout gradient magnetic fields.

The phase differences occurring on an echo-by-echo basis in the FSE method include one-dimensional phase differences serving as direct functions of location and phase differences without location dependency occurring due to a mismatch in coil arrangement. The phase differences without location dependency are called the zero-dimensional phase differences. The one-dimensional phase calculated with respect to each set of MR signal data is corrected and the zero-dimensional phase differences are calculated by obtaining the phase average. The zero-dimensional phase differences include the effect of not only the zero-dimensional phase differences of the readout gradient magnetic fields and the zero-dimensional and one-dimensional phase differences of the slice selection gradient magnetic fields, but also the zero-dimensional phase differences of the phase encode gradient magnetic fields.

The correction amount calculating unit 26c calculates the one-dimensional and zero-dimensional phase differences in the echo signals collected during the pre-scan. Such phase differences correspond to the phase shifts occurring due to the readout gradient magnetic fields, the slice selection gradient magnetic fields, and the phase encode gradient magnetic fields.

For example, assume that the pulse sequence illustrated in FIG. 4 is executed. In that case, the correction amount calculating unit 26c calculates a phase difference p1 between the echo signal Echo10 collected at the 10-th count and the echo signal Echo11 collected at the 11-th count illustrated in FIG. 4. Then, as the correction amount, the correction amount calculating unit 26c calculates a phase shift p1 from the calculated phase difference.

Meanwhile, herein, although the 10-th echo signal and the 11-th echo signal are used in calculating the correction amount, it is also possible to further use a plurality of echo signals from the 12-th echo signal onward. For example, assuming that the phase difference between the 10-th echo signal and the 11-th echo signal is the phase difference p1, assuming that the phase difference between the 12-th echo signal and the 11-th echo signal is a phase difference p1_2, and assuming that the phase difference between the 12-th echo signal and the 13-th echo signal is a phase difference p1_3; the correction amount calculating unit 26c can set the phase shift, which occurs in the phase encode direction due to the phase encode gradient magnetic fields, as (p1+p1_2+p1_3)/3.

Based on the phase shift calculated by the correction amount calculating unit 26c, the sequence correcting unit 26d corrects the pulse sequence for main-scanning. More particularly, when the correction amount calculating unit 26c calculates the phase shift, the sequence correcting unit 26d refers to the calculated phase shift and corrects the sequence execution data for main-scanning stored in the sequence-execution-data memory unit 23a.

Herein, the sequence correcting unit 26d corrects the pulse sequence for main-scanning in such a way that the phase shifts calculated by the correction amount calculating unit 26c become zero. At that time, for example, regarding the one-dimensional phase differences, the sequence correcting unit 26d changes the pulse sequence for main-scanning in such a way that a correction gradient magnetic field is applied between the flip pulse and the flop pulses. Besides, the sequence correcting unit 26d can also add the correction gradient magnetic fields before and after the readout gradient magnetic fields in the pulse sequence for main-scanning. Moreover, for example, regarding the zero-dimensional phase differences, the sequence correcting unit 26d changes the phases of the flop pulses in such a way that the phase shifts become zero.

In this way, the sequence correcting unit 26d corrects the pulse sequence for main-scanning in such a way that the phase shifts observed during the pre-scan become zero. As a result, it becomes possible to obtain an image that is neither affected by the zero-dimensional eddy currents and the one-dimensional eddy currents of the readout gradient magnetic fields and the slice selection gradient magnetic fields, nor affected by the zero-dimensional eddy currents of the phase encode gradient magnetic fields.

Figure 5:
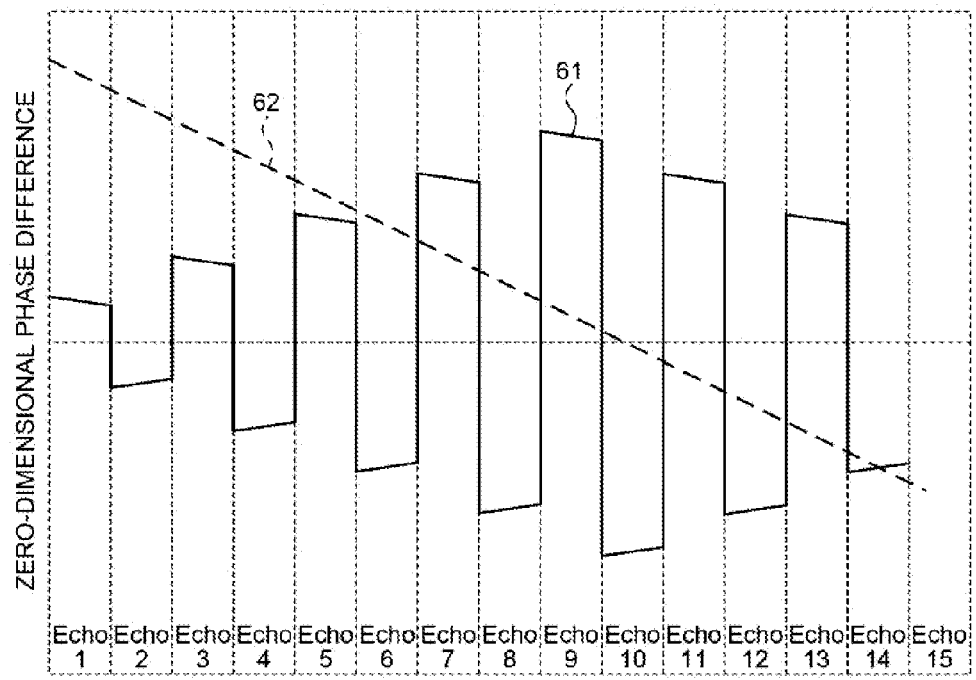
FIGS. 5 and 6 are explanatory diagrams for explaining a phase shift correction operation performed by the sequence correcting unit.
Figure 6:
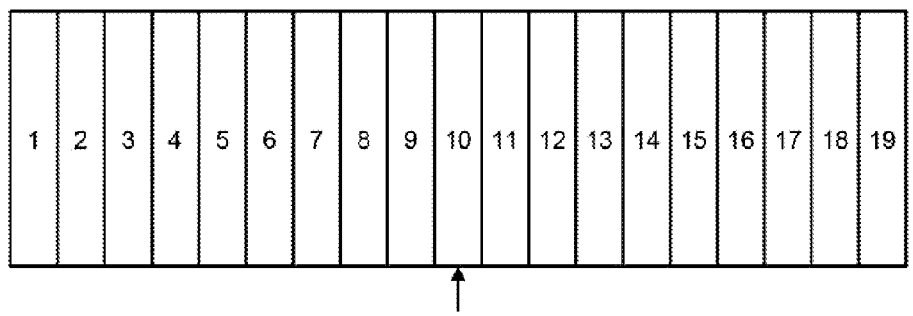

FIGS. 5 and 6 are explanatory diagrams for explaining the phase shift correction operation performed by the sequence correcting unit 26d. FIG. 5 illustrates an example of phase shifts occurring in the phase encode direction. In FIG. 5, a solid line 61 represents the zero-dimensional phase shifts for the echo signals in the phase encode direction, while a dashed line 62 represents the intensity of a phase encode magnetic field. FIG. 6 illustrates the k-space in which the echo signals illustrated in FIG. 5 are arranged. In FIG. 6, the horizontal direction illustrates the phase encode direction.

Herein, the zero-dimensional phase shifts in the phase encode direction depend on the manner of arranging the echo signals in the k-space. In the example illustrated in FIG. 5, with respect to the k-space, the collected echo signals are sequentially arranged in the phase encode direction. The numbers illustrated in FIG. 6 represent the order of the collected echo signals. When the pre-scan is executed using the pulse sequence illustrated in FIG. 4, the position corresponding to the echo signal Echo10 collected at the 10-th count (the position indicated by an arrow in FIG. 6) is corrected. That is, the zero-dimensional phase shift of the echo signal disposed in the vicinity of the k-space is corrected. Meanwhile, herein, although the explanation is given for the case of performing correction with the echo signal Echo10 collected at the 10-th count serving as the reference signal, any other signal can be used as the reference signal.

The main-scan executing unit 26e executes the main-scan using the pulse sequence for main-scanning corrected by the sequence correcting unit 26d. More particularly, once the sequence correcting unit 26d corrects the sequence execution data for main-scanning, the pre-scan executing unit 26e reads the post-correction sequence execution data from the sequence-execution-data memory unit 23a. Then, the main-scan executing unit 26e executes the main-scan by sending that sequence execution data to the sequence control unit 10 via the interface unit 21.

Figure 7:
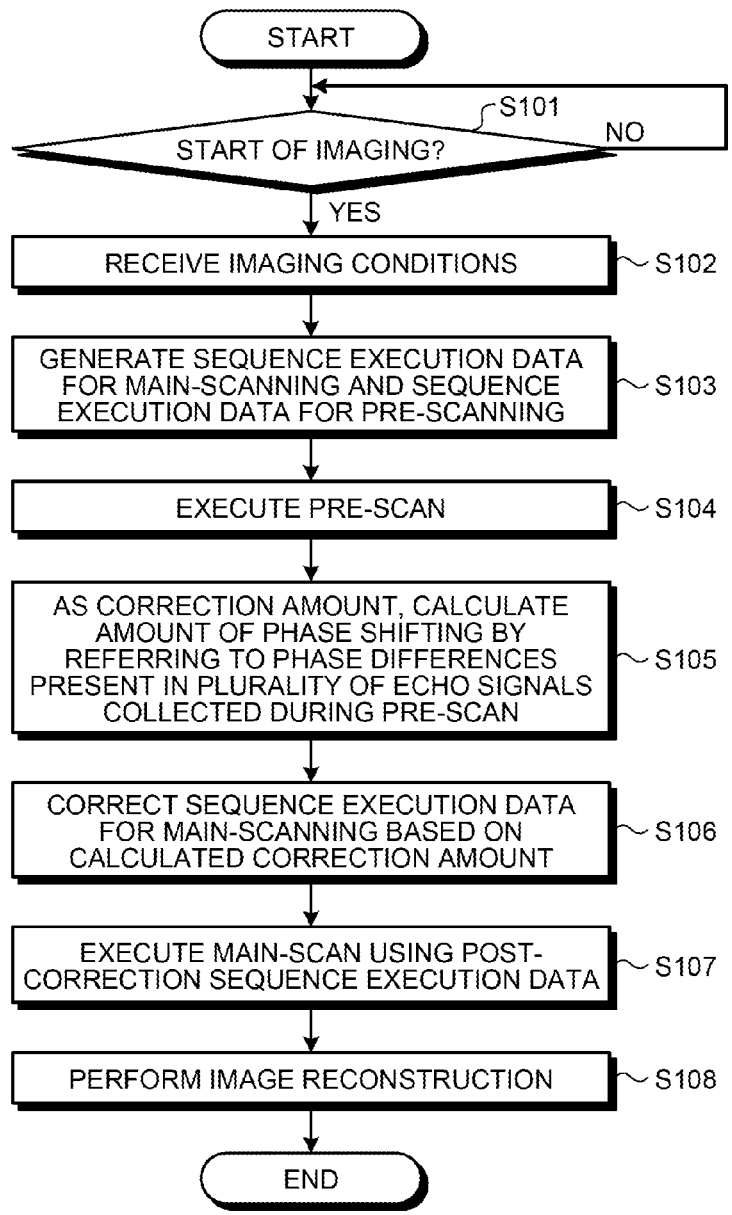
FIG. 7 is a flowchart for explaining a sequence of operations in the phase shift correction operation performed in the MRI apparatus according to the first embodiment.

Explained below is a sequence of operations in the phase shift correction operation performed in the MRI apparatus 100 according to the first embodiment. FIG. 7 is a flowchart for explaining a sequence of operations in the phase shift correction operation performed in the MRI apparatus 100 according to the first embodiment.

As illustrated in FIG. 7, in the MRI apparatus 100 according to the first embodiment, when the operator instructs the start of imaging (Yes at Step S101), the imaging condition setting unit 26a receives imaging conditions input by the operator via the input unit 24 (Step S102).

Subsequently, based on the imaging conditions input by the operator, the imaging condition setting unit 26a generates sequence execution data for main-scanning and sequence execution data for pre-scanning (Step S103).

For example, as the sequence execution data for main-scanning, the imaging condition setting unit 26a generates the sequence execution data defining the pulse sequence illustrated in FIG. 3. Similarly, as the sequence execution data for pre-scanning, the imaging condition setting unit 26a generates the sequence execution data defining the pulse sequence illustrated in FIG. 4.

Then, the pre-scan executing unit 26b executes a pre-scan based on the sequence execution data of pulse sequences generated by the imaging condition setting unit 26a (Step S104).

Subsequently, the correction amount calculating unit 26c calculates, as the correction amount, the amount of phase shifting by referring to the phase differences present in a plurality of echo signals collected during each pre-scan (Step S105). Then, the sequence correcting unit 26d corrects the sequence execution data for main-scanning based on the correction amount calculated by the correction amount calculating unit 26c (Step S106).

Subsequently, the main-scan executing unit 26e executes a main-scan based on the sequence execution data for main-scanning corrected by the sequence correcting unit 26d (Step S107). Then, the image reconstructing unit 22 performs image reconstruction from the MR signal data collected during the main-scan (Step S108).

As described above, in the first embodiment, the pre-scan executing unit 26b executes pre-scans. Herein, during a pre-scan, readout gradient magnetic fields and slice direction gradient magnetic fields are applied in an identical manner to the pulse sequence for main-scanning, and phase encode gradient magnetic fields are applied in an identical manner to the pulse sequence for main-scanning up to just before the echoes used in calculating the correction amount. For example, during a pre-scan, in an identical manner to the pulse sequence for main-scanning, the readout gradient magnetic fields and the slice direction gradient magnetic fields are applied; and, of the phase encode magnetic gradient fields applied in the pulse sequence for main-scanning, at least a single phase encode magnetic gradient field is applied up to the echo in the vicinity of the k-space center. Then, from the phase differences present in a plurality of echo signals collected during the pre-scan, the correction amount calculating unit 26c calculates, as the correction amount, the amount of phase shifting (zero-dimensional and one-dimensional) occurring due to the readout gradient magnetic fields and the slice selection gradient magnetic fields, and the amount of zero-dimensional phase shifting occurring due to the phase encode gradient magnetic field. Based on the correction amount calculated by the correction amount calculating unit 26c, the sequence correcting unit 26d corrects the pulse sequence for main-scanning. Thus, according to the first embodiment, it becomes possible to prevent image deterioration that may occur due to the zero-dimensional eddy currents and the one-dimensional eddy currents of the readout gradient magnetic fields and the slice selection gradient magnetic fields, as well as due to the zero-dimensional eddy currents of the phase encode gradient magnetic fields.

Moreover, in the first embodiment, in the pulse sequence for pre-scanning, phase encode gradient magnetic fields are applied in an identical manner to the pulse sequence for main-scanning either for a period identical to the period during the main-scan in which the phase encode gradient magnetic fields become zero or up to just before the echo signal that is collected in the vicinity of the period during the main-scan in which the phase encode gradient magnetic fields become zero. Thus, according to the first embodiment, the echo signal that is arranged in the vicinity of the k-space center and that greatly contributes to the image quality is subjected to phase shift correction. That enables achieving further enhancement in the image quality of the images generated by the MRI apparatus 100.

Meanwhile, as a modification example of the first embodiment, the pre-scan executing unit 26b can be configured to perform the pre-scan for a plurality of number of times. For example, the pre-scan executing unit 26b can be configured to perform a first pre-scan during which readout gradient magnetic fields and slice direction gradient magnetic fields are applied in an identical manner to the pulse sequence for main-scanning, and phase encode gradient magnetic fields are applied in an identical manner to the pulse sequence for main-scanning up to just before the echoes used in calculating the correction amount; and configured to perform a second pre-scan during which a second pulse sequence is used in which phase encode gradient magnetic fields are applied that are different than the phase encode gradient magnetic fields applied during the first pre-scan.

For example, as the first pre-scan, the pre-scan executing unit 26b applies the phase encode gradient magnetic fields of that shot, from among a plurality of shots, which applies the greatest phase encode gradient magnetic field in the leading echo; and, as the second pre-scan, the pre-scan executing unit 26b applies the phase encode gradient magnetic fields of that shot which applies the smallest phase encode gradient magnetic field in the leading echo.

Figure 8:
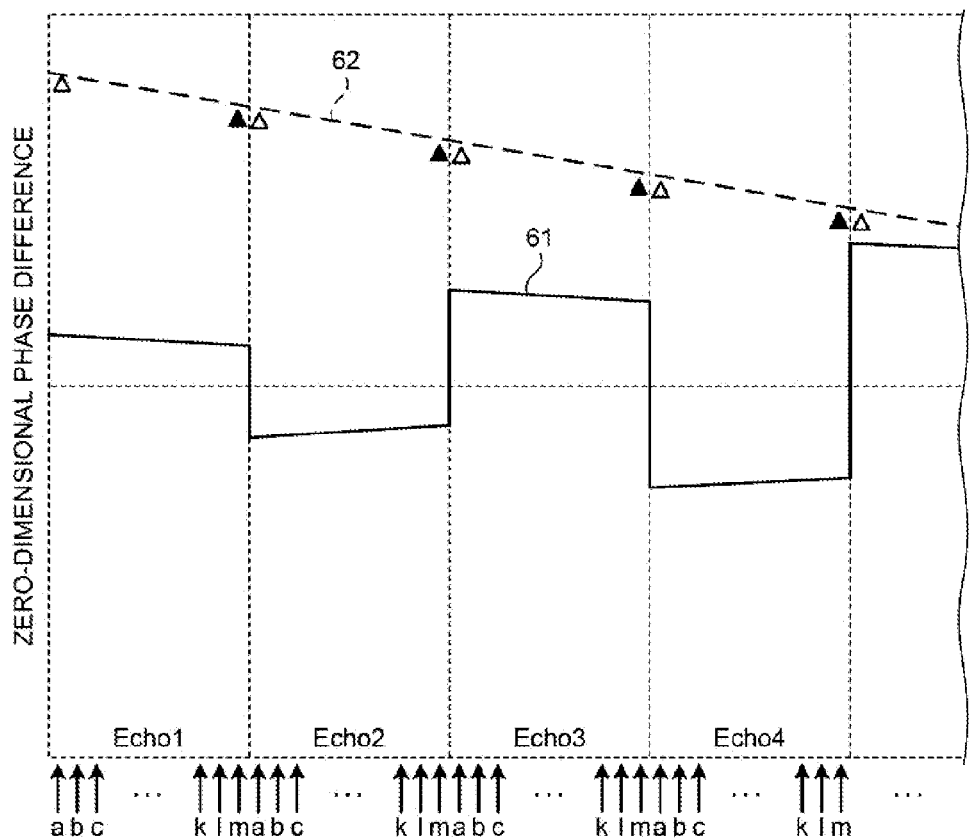
FIG. 8 is an explanatory diagram for explaining a modification example of the first embodiment.

FIG. 8 is an explanatory diagram for explaining the modification example of the first embodiment. In FIG. 8, of the phase shifts in the phase encode direction illustrated in FIG. 5, the phase shifts from the first echo signal (Echo1) up to the fourth echo signal (Echo4) are illustrated. In an identical manner to FIG. 5, the solid line 61 represents the zero-dimensional phase shifts for the echo signals in the phase encode direction, while the dashed line 62 represents the intensity of a phase encode magnetic field.

For example, in the example illustrated in FIG. 8, it is illustrated that a plurality of shots a, b, c, ..., k, l, and m are used. Moreover, for example, as illustrated in FIG. 8, of the shots a, b, c, ..., k, l, and m; assume that, in the first echo signal (Echo1), the shot applying the greatest phase encode gradient magnetic field is the shot a and the shot applying the smallest phase encode gradient magnetic field is the shot m. In that case, as the first pre-scan, the pre-scan executing unit 26b applies the phase encode of the shot "a" (see white triangles illustrated in FIG. 8); and, as the second pre-scan, the pre-scan executing unit 26b applies the phase encode of the shot "m" (see black triangles illustrated in FIG. 8).

In this case, for example, assuming that the phase difference during the first pre-scan is the phase difference p1 and assuming that the phase difference during the second pre-scan is the phase difference p2; the correction amount calculating unit 26c can set the phase difference p1 as the correction amount with respect to the shot "a", set the phase difference p2 as the correction amount with respect to the shot "m", and obtain the correction amount of the shots in between by interpolation. More particularly, if a number of shots is considered to be N, the correction amount for a shot having the greatest phase encode gradient magnetic field at the i-th count is $p1+(p2-p1)*(i-1)/(N-1)$.

Figure 9A:
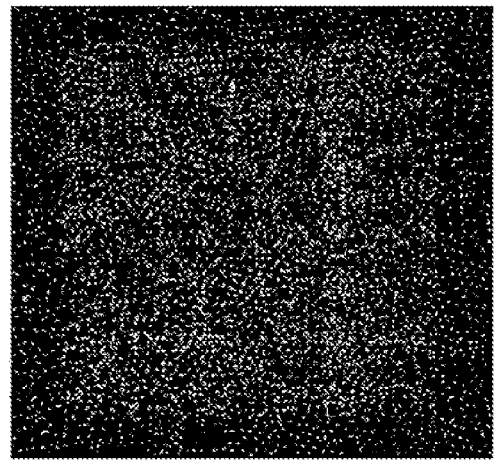
FIG. 9A is a diagram illustrating an exemplary image captured during the conventional pre-scan.
Figure 9B:
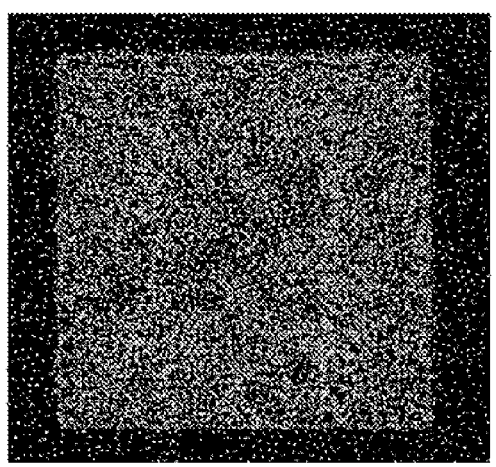
FIG. 9B is a diagram illustrating an exemplary image captured during the pre-scan according to the first embodiment.

FIG. 9A is a diagram illustrating an exemplary image captured during the conventional pre-scan. FIG. 9B is a diagram illustrating an exemplary image captured during the pre-scan according to the first embodiment. FIG. 9A illustrates an exemplary image collected during the conventional pre-scan by skipping the phase encode. FIG. 9B illustrates an exemplary image collected during the pre-scan according to the first embodiment. As illustrated in FIGS. 9A and 9B, it can be observed that signal deterioration, which occurs due to the zero-dimensional phase shifts caused by the phase encode gradient magnetic fields, has improved in the first embodiment.

Second Embodiment

In the first embodiment, the explanation is given for correcting the phase shift of the echo signal disposed in the vicinity of the k-space center. However, that is not the only possible embodiment of the MRI apparatus 100. Explained below is a second embodiment in which the phase shifts of a plurality of echo signals are corrected. According to the second embodiment, the configuration of the MRI apparatus is essentially identical to the configuration illustrated in FIGS. 1 and 2. However, the operations performed by the imaging condition setting unit 26a, the pre-scan executing unit 26b, the correction amount calculating unit 26c, and the sequence correcting unit 26d are different as compared to the first embodiment.

In the second embodiment, the imaging condition setting unit 26a generates sequence execution data regarding not only the pulse sequence for main-scanning and a first pulse sequence for the first pre-scan (i.e., the pulse sequence illustrated in FIG. 4), but also regarding a second pulse sequence for the second pre-scan described below.

Figure 10:
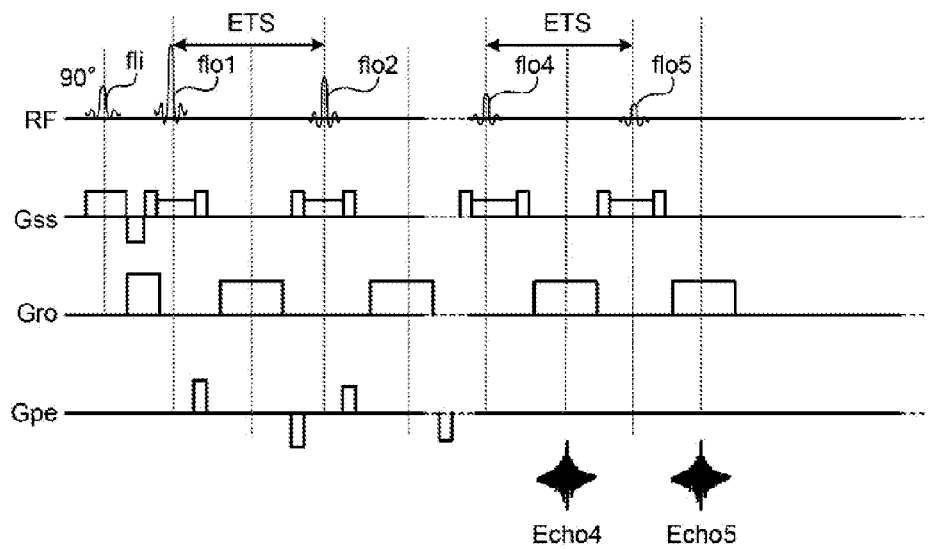
FIG. 10 is a diagram illustrating a second pulse sequence for the second pre-scan according to a second embodiment.

FIG. 10 is a diagram illustrating a second pulse sequence for the second pre-scan according to the second embodiment. In the second pulse sequence, as compared to the phase encode gradient magnetic fields applied during the first pre-scan, the phase encode gradient magnetic fields corresponding to a different number of echoes are applied. For example, as illustrated in FIG. 10, in the second pulse sequence, the phase encode gradient magnetic fields identical to the pulse sequence for main-scanning are applied for a smaller number of echoes as compared to the first pre-scan. Meanwhile, the readout gradient magnetic fields and the slice selection readout gradient magnetic fields are identical to the first pre-scan.

For example, as illustrated in FIG. 10, in the second pulse sequence, the setting is such that the phase encode gradient magnetic fields up to the third echo signal are applied.

In the second embodiment, the pre-scan executing unit 26b executes not only the first pre-scan, but also the second pre-scan using the second pulse sequence illustrated in FIG. 10.

Moreover, in the second embodiment, the correction amount calculating unit 26c calculates a first-type phase shift from a plurality of echo signals collected during the first pre-scan as well as calculates a second-type phase shift from the phase differences present in a plurality of echo signals collected during the second pre-scan. Then, from the first-type phase shift and the second-type phase shift, the correction amount calculating unit 26c calculates the correction amount related to a plurality of echo signals.

For example, assume that the first pulse sequence illustrated in FIG. 4 and the second pulse sequence illustrated in FIG. 10 are executed. In that case, the correction amount calculating unit 26c calculates the phase difference p1 between the 10-th echo signal Echo10 and the 11-th echo signal Echo11 illustrated in FIG. 4 as well as calculates the phase difference p2 between the fifth echo signal Echo5 and the fourth echo signal Echo4 illustrated in FIG. 10.

Moreover, the correction amount calculating unit 26c calculates p1 as the first-type phase shift and calculates p2 as the second-type phase shift. Herein, the first-type phase shift p1 becomes a phase shift dif10 in the 10-th echo signal Echo10. Similarly, the second-type phase shift p2 becomes a phase shift dif4 in the fourth echo signal Echo4.

Then, from the first-type phase shift and the second-type phase shift, the correction amount calculating unit 26c calculates the correction amount for the echo signals other than the fourth echo signal and the 10-th echo signal. For example, during the main-scan, when the phase encode gradient magnetic field becomes zero in the echo signal Echo10 collected at the 10-th count, the phase shift in the echo signals gradually increases up to the echo signal Echo10 and gradually decreases subsequent to the echo signal Echo10. With that, it can be assumed that, for example, a phase shift dif16 in the 16-th echo signal is equivalent to the phase shift dif4 in the fourth echo signal Echo4.

There, assuming that the echo signal at which the phase encode gradient magnetic field becomes zero during the main-scan serves as the reference signal, the correction amount calculating unit 26c refers to the phase shifts in the echo signals collected prior to the reference echo signal and estimates the phase shifts in the echo signals collected subsequent to the reference echo signal. Moreover, the correction amount calculating unit 26c calculates the phase shift in a plurality of echo signals by performing linear interpolation on the phase shift in each echo signal that has been calculated.

Figure 11:
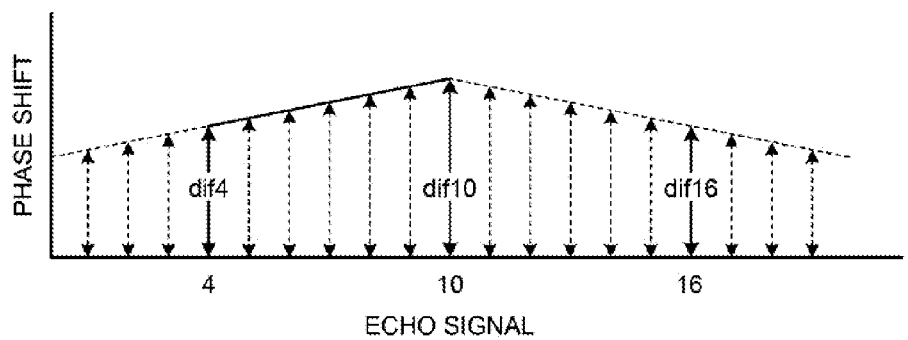
FIG. 11 is an explanatory diagram for explaining the calculation of phase shifts performed by the sequence correcting unit according to the second embodiment.

FIG. 11 is an explanatory diagram for explaining the calculation of phase shifts performed by the sequence correcting unit 26d according to the second embodiment. As illustrated in FIG. 11, for example, with the 10-th echo signal Echo10 as the reference signal, the sequence correcting unit 26d refers to the phase shift dif4 in the fourth echo signal Echo4 and estimates the phase shift dif16 in the 16-th echo signal Echo16. Subsequently, the correction amount calculating unit 26c calculates the phase shift of a plurality of echo signals by performing linear interpolation on the phase shift dif4 in the echo signal Echo4, the phase shift dif10 in the echo signal Echo10, and the phase shift dif16 in the echo signal Echo16.

Moreover, in the second embodiment, based on the phase shift calculated by the sequence correcting unit 26d, the sequence correcting unit 26d corrects the intensity of the gradient magnetic field in the phase encode direction applied in each echo signal in the pulse sequence for main-scanning. At that time, for example, the sequence correcting unit 26d changes the intensity of the phase encode gradient magnetic field applied in each echo signal in such a way that the phase shift in each echo signal becomes zero. Alternatively, the sequence correcting unit 26d can also change the intensity of a rewind gradient magnetic field so that the phase shift in each echo signal becomes zero.

As described above, in the second embodiment, the pre-scan executing unit 26b also performs the second pre-scan. During the second pre-scan, as compared to the phase encode gradient magnetic fields applied during the first pre-scan, the phase encode gradient magnetic fields corresponding to a different number of echoes are applied. For example, during the second pre-scan, the phase encode gradient magnetic fields identical to the pulse sequence for main-scanning are applied for a smaller number of echoes as compared to the first pre-scan. Moreover, the correction amount calculating unit 26c calculates the second-type phase shift from the phase differences present in a plurality of echo signals collected during the first pre-scan and from the phase differences present in a plurality of echo signals collected during the second pre-scan. Then, from the first-type phase shift and the second-type phase shift, the correction amount calculating unit 26c calculates the correction amount related to a plurality of echo signals. Subsequently, based on the phase shift calculated for each echo signal by the correction amount calculating unit 26c, the sequence correcting unit 26d corrects the pulse sequence for main-scanning. Thus, according to the second embodiment, the phase shift of each echo signal collected during the main-scan is corrected. As a result, image deterioration can be prevented with accuracy.

Moreover, in the second embodiment, assuming that the echo signal at which the phase encode gradient magnetic field becomes zero during the main-scan serves as the reference signal, the correction amount calculating unit 26c refers to the phase shifts in the echo signals collected prior to the reference echo signal and estimates the phase shifts in the echo signals collected subsequent to the reference echo signal. In contrast, it is also possible to execute the pre-scan for one more time and estimate the phase shifts in the echo signals collected subsequent to the echo signal at which the phase encode gradient magnetic field becomes zero during the main-scan. That makes it possible to more accurately prevent image deterioration that may occur due to phase shifts in the phase encode direction.

In the first and second embodiments, the explanation is given for a case when, in a single collection, the echo signals are arranged in the entire area of the k-space. In contrast, there are times when the k-space is divided into a plurality of areas in the phase encode direction and, in a plurality of collections, a plurality of echo signals is collected in groups. In such a case, the phase shift can be calculated on a group-by-group basis and the pulse sequence for main-scanning can be corrected on a group-by-group basis.

Figure 12:
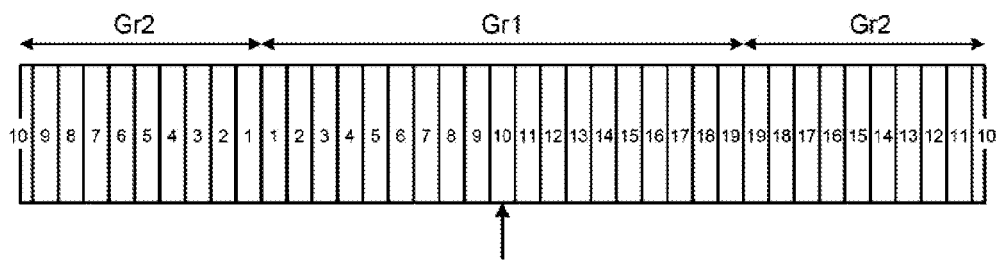
FIG. 12 is an explanatory diagram for explaining a modification example of the first and second embodiments.

FIG. 12 is an explanatory diagram for explaining a modification example of the first and second embodiments. FIG. 12 illustrates an exemplary case when the k-space along the phase encode direction is divided into three areas. A vertical arrow illustrated in FIG. 12 indicates the k-space center. Herein, for example, the echo signals are collected in two groups Gr1 and Gr2. In that case, for example, as illustrated in FIG. 12, with respect to the central area, the echo signals in the group Gr1 are arranged in order in the phase encode direction. Regarding the echo signals in the group Gr2, the echo signals collected in the first half are arranged in order in one of the two side areas of the k-space and the echo signals collected in the latter half are arranged in order in the other of the two side areas of the k-space.

In such a case, for example, the correction amount calculating unit 26c can be configured to calculate the correction amount on a group-by-group basis. Moreover, in this case, the sequence correcting unit 26d corrects the pulse sequence for main-scanning on a group-by-group basis. Alternatively, for example, the correction amount calculating unit 26c can calculate the correction amount regarding one of the groups and the sequence correcting unit 26d can correct the pulse sequence for main-scanning for all groups based on that particular correction amount.

Third Embodiment

Figure 13:
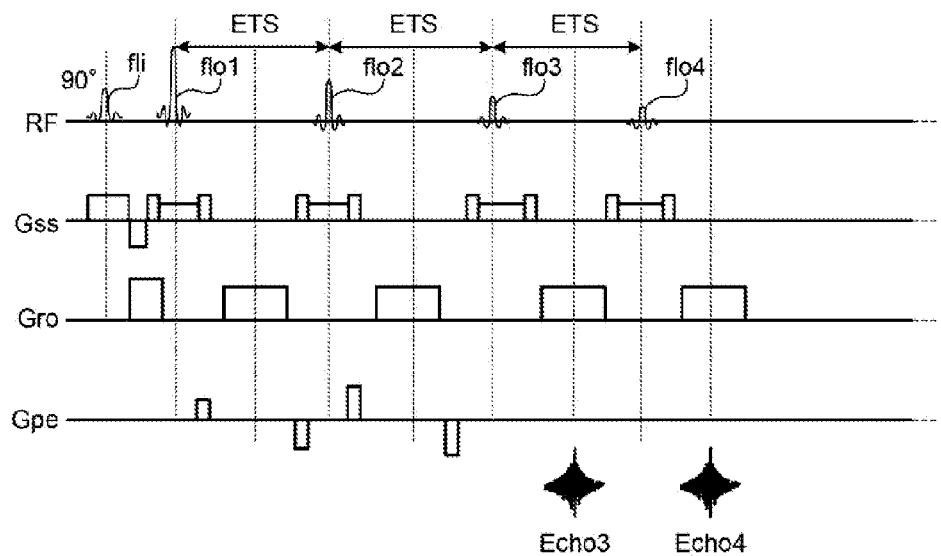
FIG. 13 is a diagram illustrating the pulse sequence for pre-scanning according to a third embodiment.

Explained below is an example of collection and correction of echo signals according to a third embodiment when the k-space center is positioned at the leading echo. In the third embodiment, as the pre-scan, the pre-scan executing unit 26b applies at least a single phase encode gradient magnetic field. FIG. 13 is a diagram illustrating the pulse sequence for pre-scanning according to the third embodiment. As illustrated in FIG. 13, for example, the pre-scan executing unit 26b applies the phase encode magnetic fields up to the second echo signal, and makes use of the echo signals from the third echo signal onward for calculating the correction amount.

Figure 14:
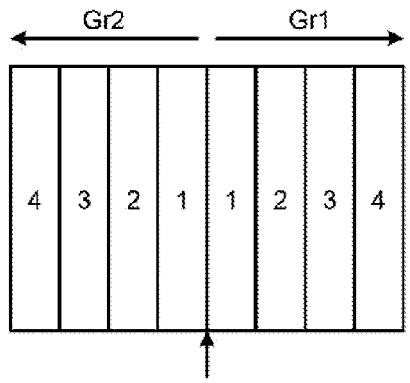
FIG. 14 is an explanatory diagram for explaining collection of echo signals according to the third embodiment.

FIG. 14 is an explanatory diagram for explaining collection of echo signals according to the third embodiment. As illustrated in FIG. 14, usually, when the k-space center is positioned at the leading echo, the echo signals are collected by dividing the k-space into two groups. In such a case, as the first pre-scan, the pre-scan executing unit 26b applies the representative phase encode gradient magnetic field of the group Gr1; and, as the second pre-scan, the pre-scan executing unit 26b applies the representative phase encode gradient magnetic field of the group Gr2. Then, in an identical manner to the first and second embodiment, the correction amount calculating unit 26c calculates the correction amount from the phase differences of a plurality of echoes in each pre-scan.

Meanwhile, in the pulse sequence used in the pre-scans, the gradient magnetic field such as a pre-pulse used in the main-scan is applied in an identical manner.

Fourth Embodiment

Figure 15:
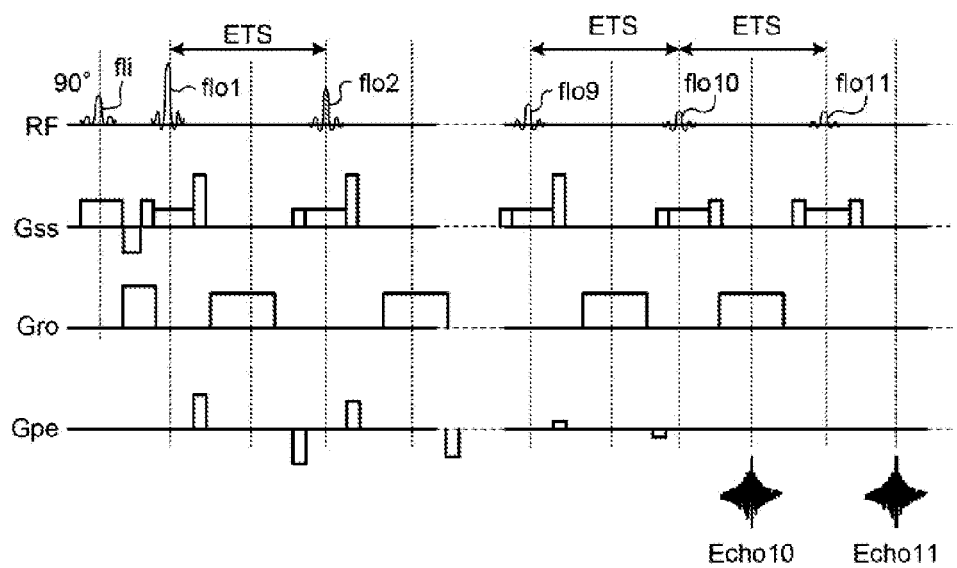
FIG. 15 is a diagram illustrating the second pulse sequence for the second pre-scan according to a fourth embodiment.

As a fourth embodiment, the explanation is given regarding a case in which the first to third embodiments are used in combination with a pre-scan that takes into account the phase shifts caused due to the slice encode of 3D collection sequence. FIG. 15 is a diagram illustrating the second pulse sequence for the second pre-scan according to the fourth embodiment. In the fourth embodiment, the pre-scan executing unit 26b executes the first pre-scan using the first pulse sequence illustrated in FIG. 4 as well as executes the second pre-scan using the second pulse sequence illustrated in FIG. 15.

Herein, for example, in the first pulse sequence, in an identical manner to the first embodiment, the representative phase encode gradient magnetic field of the main-scan is applied up to just short of the echoes in the vicinity of the k-space center. In the second pulse sequence, in addition to the phase encode gradient magnetic field applied during the first pre-scan, at least one of the slice encode phase gradient magnetic fields for the main-scan is applied. For example, of the slice encode gradient magnetic fields applied in the pulse sequence for main-scanning, the representative slice encode gradient magnetic field is applied in the second pulse sequence.

Then, according to the fourth embodiment, from the phase differences present in a plurality of echo signals collected during the first pre-scan and the phase differences present in a plurality of echo signals collected during the second pre-scan, the correction amount calculating unit 26c calculates, as the correction amount, the phase shift occurring in the slice encode direction due to the slice encode gradient magnetic field. Moreover, based on the correction amount calculated by the correction amount calculating unit 26c, the sequence correcting unit 26d corrects the pulse sequence for main-scanning. Hence, according to the fourth embodiment, it becomes possible to prevent image deterioration that may occur due to the phase shifts in the slice encode direction.

For example, when the slice encode count (slice count) is 64, the slice encode steps are −32 to 31. For example, in the second pulse sequence, assume that the slice encode corresponding to −32 is applied, assume that the phase difference (zero-dimensional or one-dimensional) between Echo10 and Echo11 during the first pre-scan is s1, and assume that the phase difference (zero-dimensional or one-dimensional) between Echo10 and Echo11 during the second pre-scan is s2. Then, the phase difference due to the i-th slice encode can be obtained by (s2−s1)*(−i)/32. By correcting the phase of the 180-degree pulse, it becomes possible to correct the phase shifts occurring due to slice encodes. Moreover, by increase the number of times of executing the pre-scan in the abovementioned case (for example, by applying the slice encode corresponding to +31), it becomes possible to enhance the accuracy.

As described above, according to the first to four embodiments, it becomes possible to prevent image deterioration that may be caused by zero-dimensional phase shifts of the phase encode gradient magnetic fields.

Fifth Embodiment

Given below is the explanation of a fifth embodiment. According to the first to fourth embodiments, it is possible to prevent image deterioration that may occur due to the zero-dimensional phase shifts of the phase encode gradient magnetic fields. However, by applying the phase encode gradient magnetic fields during the pre-scan, the phase correction amount cannot be correctly obtained due to the dependency on the RF coil or the field of view used in imaging. That may sometime cause degradation in the image quality.

Figure 16:
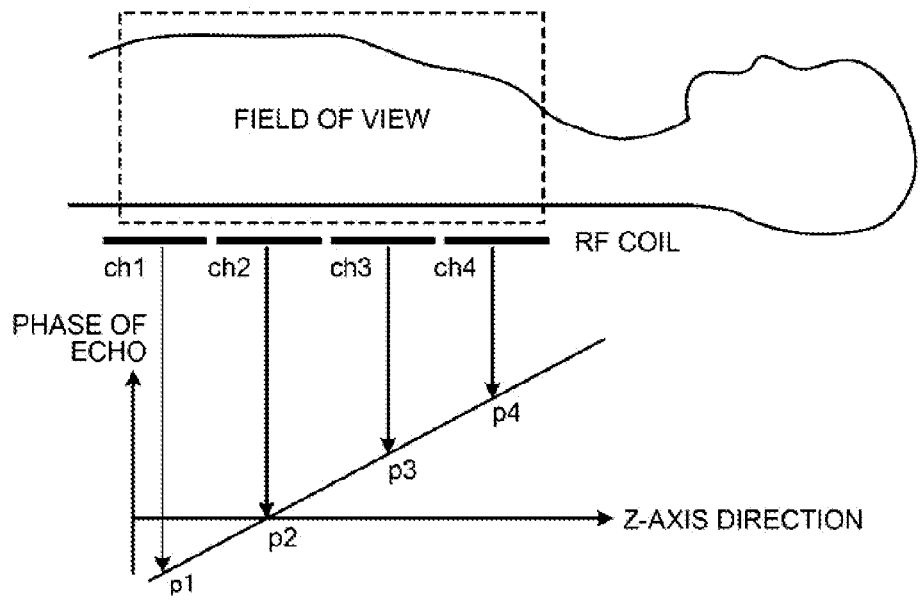
FIG. 16 is an explanatory diagram for explaining the MRI apparatus according to a fifth embodiment.

FIG. 16 is an explanatory diagram for explaining the MRI apparatus according to the fifth embodiment. FIG. 16 illustrates an example when a sagittal cross-section of the lumber spine is captured with the Z-axis direction serving as the phase encode direction. In the example illustrated in FIG. 16, a phased array coil (PAC) is used as the RF coil and four coil elements included in the PAC coil are arranged in the Z-axis direction. In this example, as described in the abovementioned embodiments, when phase encode gradient magnetic fields are applied, one-dimensional phase shifts occur in the Z-axis direction. However, in the abovementioned embodiments, since sampling in the phase encoding direction is not performed, it is not possible to calculate and correct the one-dimensional phase shifts in the phase encode direction.

Herein, if the phase correction amount is obtained for each RF coil by implementing the conventional method; then, as illustrated in FIG. 16, at channels ch1 to ch4 connected to the four coil elements; one-dimensional phase shifts p1 to p4, respectively, are obtained. In that case, for example, the zero-dimensional phase shift amount to be corrected can be obtained as the average of the phase shifts p1 to p4 or as the weighted average of the signal intensities of the coil elements. However, for example, in the case when the phase shift p1 is −170° and the phase shift p3 is either 178°, which is in the vicinity of 180°, or −182°; it is not possible to properly perform the Unwrap operation. Moreover, depending on the type of the RF coil, the phases cannot be calculated in a correct manner. Hence, the method of obtaining the phase for each coil element may not necessarily be implemented in a proper manner.

Meanwhile, instead of obtaining the phase for each coil element, it is also possible to make use of data of the coil element that detects the greatest signal. However, in this method, if the channel ch1 or the channel ch4 detects the greatest signal, only the image quality in the vicinity of that coil element is enhanced. As the distance from that coil element increases, the image quality suffers from extreme degradation.

In order to resolve such an issue, in the fifth embodiment, the MRI apparatus 100 adds the data of all coil elements and calculates a single phase correction amount. More particularly, in the manner described below, the correction amount calculating unit 26c adds a plurality of echo signals collected via a plurality of coil elements during a pre-scan, and calculates a single phase correction amount to be used in correcting the phase differences present in a plurality of echo signals collected during the main-scan.

For example, regarding the calculation of phase correction amounts, the one-dimensional (inclined) phase angle (rad) is referred to as $\theta_1$ and the zero-dimensional (offset) phase angle (rad) of the i-th slice is referred to as $\theta_{0,i}$. Moreover, the readout point count is referred to as N, the echo count is referred to as M, the slice count is referred to as NS ($0 \le i < NS$), the PAC channel count is referred to as L ($0 \le l < L$), the pre-scan data is referred to as P(x, i, l) (however, complex data after 1D Fourier conversion: ($0 \le x < N$)), and the score for obtaining the first-dimensional phase (e.g., four points) is referred to as dxx. Then, $\theta_1$ and $\theta_{0,i}$ can be obtained by Equations (1) and (2) given below.

$$\theta_1 = \arg\left(\sum_{l=0}^{l=L-1} \sum_{i=0}^{NS-1} \sum_{x=0}^{N-1} (P(x, i, l)\overline{P_k}(x - dxx, i, l))\right) \quad (1)$$

$$\theta_{0,i} = \arg\left(\sum_{l=0}^{l=Lc-1} \sum_{x=0}^{N-1} \left(P(x, i, l)e^{+i(\theta_1(x-\frac{N}{2}))}\right)\right) \quad (2)$$

Using Equations (1) and (2) given above, the correction amount calculating unit 26c calculates $\theta_1$ and $\theta_{0,i}$ as phase correction amounts. According to this method, it becomes possible to obtain such an average phase correction amount within the field of view which is neither affected by the difference in the signal-to-noise ratio (SNR) in each coil element nor affected by the phase differences. Besides, this method is also effective against the conventional pre-scan in which the phase encode gradient magnetic fields are not applied.

Thus, according to the fifth embodiment, it becomes possible to obtain the phase correction amount in a stable manner regardless of the coil elements. As a result, degradation in the image quality can be prevented.

Besides, although the example in which signals collected through all of the coil elements are used is explained above, it is also possible to exclude signals collected through channels on which SNR of signals are bad and/or channels on which correct phases of signals are not obtained.

Sixth Embodiment

Explained below is a sixth embodiment. In the fifth embodiment, during phase calculation, all of the data in the readout direction is used. However, for example, the data to be used in phase calculation can be narrowed down to the data within the field of view (FOV) specified by the user.

Figure 17:
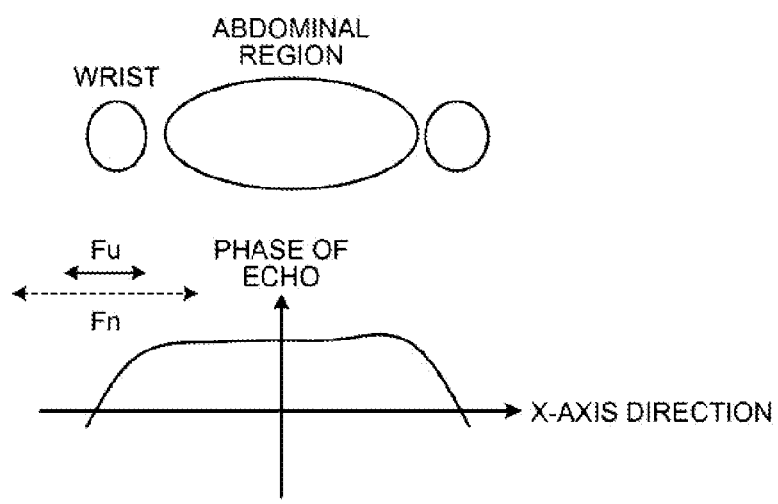
FIG. 17 is an explanatory diagram for explaining the MRI apparatus according to a sixth embodiment.

FIG. 17 is a diagram for explaining the MRI apparatus according to the sixth embodiment. FIG. 17 illustrates a case of capturing images of the axial cross-section of a wrist with the X-axis direction serving as the phase encode direction. In FIG. 17, the range indicated by a solid line represents the field of view specified by the operator and the range indicated by a dotted line represents the field of view with NoWrap (described below) taken into account.

Herein, NoWrap points to a function in which, a field of view wider than the field of view specified by the operator at the time of imaging planning is set as an expanded field of view and an image in the expanded field of view is generated by means of unfolding. Then, the image in the field of view specified by the operator is clipped from the expanded field of view and displayed so as to reduce the wraparound artifact.

As illustrated in FIG. 17, for example, at a position spaced apart from the center in the X-axis direction, there are times when a nonlinear phase shift occurs (see the lower diagram in FIG. 17). In such a case, if all of the data in the readout direction is used, then the data regarding the outside of the field of view specified by the operator also makes a contribution during phase calculation. That makes it difficult to obtain an accurate phase correction amount.

In order to resolve such an issue, in the sixth embodiment, the MRI apparatus 100 limits the target area for calculation in the readout direction to the area within the field of view specified by the operator. More particularly, in the manner described below, of a plurality of echo signals collected during the pre-scan, the correction amount calculation unit 26c makes use of the data within the field of view specified in the readout direction by the operator, and calculates a phase correction amount to be used in correcting the phase differences present in a plurality of echo signals collected during the main-scan.

For example, the field of view specified by the operator is referred to as Fu, the field of view with NoWrap taken into account is referred to as Fn, the number of calculation start points of readout is referred to as Nstart, and the number of calculation end points of readout is referred to as Nend. Then, Nstart and Nend can be obtained by Equations (3) and (4) given below.

$$N\text{start} = N^*(1 - Nu/Nf)/2 \qquad (3)$$

$$N\text{end} = N - N\text{start} \qquad (4)$$

Using Equations (3) and (4), the correction amount calculating unit 26c calculates Nstart and Nend−1; and performs the addition of x, mentioned in Equations (1) and (2), from Nstart up to Nend−1. According to this method, if the phases act differently on the inside and on the outside of the field of view specified by the operator, it becomes possible to eliminate the effect of the data regarding the outside of the field of view during the calculation of the phase correction amount. Besides, this method is also effective against the conventional pre-scan.

Thus, according to the sixth embodiment, it becomes possible to obtain the phase correction amount in a stable manner regardless of the field of view. As a result, degradation in the image quality can be prevented.

Seventh Embodiment

Given below is the explanation of a seventh embodiment. In the sixth embodiment, during phase calculation, the data in the readout direction is narrowed down to the data within the field of view specified by the operator. However, for example, when the Z-axis direction serves as the readout direction, magnetostatic field unevenness may also have an adverse effect. Thus, during phase calculation, the data in the readout direction can be narrowed down to the data within a range that is less affected by magnetostatic field unevenness.

Figure 18:
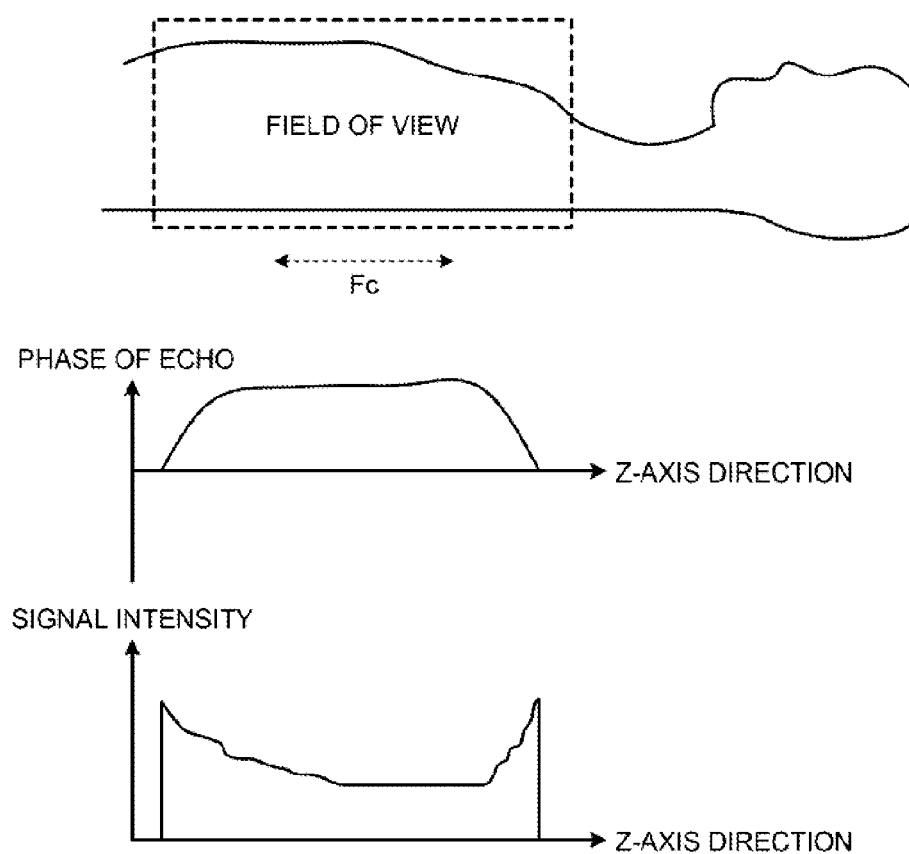
FIG. 18 is an explanatory diagram for explaining the MRI apparatus according to a seventh embodiment.

FIG. 18 is an explanatory diagram for explaining the MRI apparatus according to the seventh embodiment. FIG. 18 illustrates a case of capturing images of the abdominal region with the Z-axis direction serving as the phase encode direction. At a position spaced apart from the center in the Z-axis direction, there are times when a nonlinear phase shift occurs (see the middle diagram in FIG. 18) and when the signal intensity increases due to the effect of magnetostatic field unevenness. In such a case, if all of the data in the readout direction is used, then the data regarding the positions spaced apart from the center in the Z-direction strongly affects the phase calculation thereby making it difficult to obtain an accurate phase correction amount.

In order to resolve such an issue, in the seventh embodiment, the MRI apparatus 100 limits the target area for calculation in the readout direction to such a field of view in the Z-axis direction which is compensated at least by the system. For example, of a plurality of echo signals collected during a pre-scan, the correction amount calculating unit 26c makes use of the data of such a range which is compensated at least for magnetostatic field unevenness, and calculates a phase correction amount to be used in correcting the phase differences present in a plurality of echo signals collected during the main-scan. For example, the correction amount calculating unit 26c calculates the phase correction amount by referring to the data regarding half (i.e., the area Fc indicated in FIG. 18) of the area of the field of view in the Z-direction that is compensated by the system (i.e., the area enclosed by dotted lines). According to this method, it becomes possible to eliminate the effect of magnetostatic field unevenness during the calculation of the phase correction amount. Besides, this method is also effective against the conventional pre-scan.

Thus, according to the seventh embodiment, it becomes possible to obtain the phase correction amount in a stable manner regardless of magnetostatic field unevenness. As a result, degradation in the image quality can be prevented.

Besides, although the example in which a field of view in the Z-axis direction is limited, it is also possible to limit a field of view in X-axis direction and/or a field of view in Y-axis direction.

As described above, according to the first to seventh embodiments, it becomes possible to prevent image deterioration that may occur due to phase shifts of echo signals.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
    MRI gantry components including static and gradient magnetic field generators, at least one radiofrequency (RF) coil coupled to an imaging volume, RF transmitter and RF receiver circuits coupled to said at least one RF coil;
    at least one processor; and
    a memory that stores processor-executable instructions that, when executed by the at least one processor, cause the MRI gantry components to:
        execute a first pre-scan that produces a first set of echoes and a subsequent second pre-scan that produces a second set of echoes, each pre-scan applying a readout gradient magnetic field and slice direction gradient magnetic field in an identical manner as will be used in a subsequent main-scan pulse sequence and a phase encode gradient magnetic field that is also applied in an identical manner to the main-scan pulse sequence up to a point in time just before echoes occur in the pre-scans that are to be used in calculating a phase correction amount, and each said pre-scan having respectively different predetermined imaging parameters;

calculate, as the phase correction amount, an amount of phase shifting determined by referring to phase differences present in a plurality of echo signals in the first and second sets of echoes that are collected during the first pre-scan and the second pre-scan; and correct the main-scan pulse sequence which occurs subsequent to said second pre-scan based on the calculated phase correction amount.

2. The magnetic resonance imaging apparatus according to claim 1, wherein the executed first pre-scan and the executed second pre-scan do not apply a phase encode gradient magnetic field after echoes are obtained when calculating the phase correction amount.

3. The magnetic resonance imaging apparatus according to claim 1, wherein the executed first pre-scan and the executed second pre-scan include flop pulse groups that cause refocusing and have mutually different phases, and by referring to echo components that are obtained by performing addition or subtraction of echo signals collected during the first pre-scan and echo signals collected during the second pre-scan, calculating the phase correction amount based on phase differences present in the echo components.

4. The magnetic resonance imaging apparatus according to claim 2, wherein the executed first pre-scan and the executed second pre-scan include flop pulse groups that cause refocusing and have mutually different phases, and by referring to echo components that are obtained by performing addition or subtraction of echo signals collected during the first pre-scan and echo signals collected during the second pre-scan, calculating the phase correction amount based on phase differences present in the echo components.

5. The magnetic resonance imaging apparatus according to claim 1, wherein, in the first pre-scan and the second pre-scan, a phase encode gradient magnetic field is applied in an identical manner to the main-scan pulse sequence either (a) over a period that is identical to a period during the main-scan in which the phase encode gradient magnetic field becomes zero or (b) up to a point in time just before echo signals collected in the vicinity of the period during the main-scan in which the phase encode gradient magnetic field becomes zero.

6. The magnetic resonance imaging apparatus according to claim 2, wherein, in the first pre-scan and the second pre-scan, a phase encode gradient magnetic field is applied in an identical manner to the main-scan pulse sequence either (a) over a period that is identical to a period during the main-scan in which the phase encode gradient magnetic field becomes zero or (b) up to a point in time just before echo signals collected in the vicinity of the period during the main-scan in which the phase encode gradient magnetic field becomes zero.

7. The magnetic resonance imaging apparatus according to claim 1, wherein, in the first pre-scan and the second pre-scan, in the plurality of phase encodes that are also used in the main-scan pulse sequence, an approximately average intensity phase encode gradient magnetic field is applied.

8. The magnetic resonance imaging apparatus according to claim 1, wherein the executed second pre-scan uses a phase encode gradient magnetic field that is different than a phase encode gradient magnetic field applied during execution of the first pre-scan, a first-type phase shift is calculated from phase differences present in a plurality of echo signals collected during the first pre-scan, a second-type phase shift is calculated from phase differences present in a plurality of echo signals collected during the second pre-scan, and a phase correction amount related to a plurality of echo signals is calculated by referring to the first-type of phase shift and the second-type of phase shift, and the main-scan pulse sequence is based on the phase correction amount calculated for each echo signal.

9. The magnetic resonance imaging apparatus according to claim 1, wherein the executed second pre-scan uses a phase encode gradient magnetic field corresponding to a different number of echoes than a phase encode gradient magnetic field applied during execution of the first pre-scan, a first-type phase shift is calculated from phase differences present in a plurality of echo signals collected during the first pre-scan, a second-type phase shift is calculated from phase differences present in a plurality of echo signals collected during the second pre-scan, and a phase correction amount related to a plurality of echo signals is calculated by referring to the first-type of phase shift and the second-type of phase shift, and the main-scan pulse sequence is based on the phase correction amount calculated for each echo signal.

10. The magnetic resonance imaging apparatus according to claim 1, wherein, when, during a main-scan, a k-space in which echo signals are arranged is divided into a plurality of areas in a phase encode direction and, in each of the plurality of areas, a plurality of echo signals is collected in groups, the phase correction amount is calculated with respect to each of the groups, and the main-scan pulse sequence is corrected with respect to each of the groups.

11. The magnetic resonance imaging apparatus according to claim 1, wherein the executed second pre-scan additionally applies at least a single slice encode gradient magnetic field as used by the main-scan, a first-type phase shift is calculated from phase differences present in a plurality of echo signals collected during the first pre-scan, a second-type phase shift is calculated from phase differences present in a plurality of echo signals collected during the second pre-scan, and a phase correction amount related to a plurality of echo signals is calculated by referring to the first-type of phase shift and the second-type of phase shift, and the main-scan pulse sequence is corrected based on the phase correction amount calculated with respect to each echo signal.

12. The magnetic resonance imaging apparatus according to claim 3, wherein flop pulse groups that cause refocusing during the executed first pre-scan have phases $\pi, \pi, \pi, \pi, \ldots$ and flop pulse groups that cause refocusing during the executed second pre-scan have phases $\pi, -\pi, \pi, -\pi, \ldots$.

13. The magnetic resonance imaging apparatus according to claim 12, wherein spin echo components are extracted by adding echo signals collected during the first pre-scan and echo signals collected during the second pre-scan, and then calculating the phase correction amount based on the extracted signal.

14. The magnetic resonance imaging apparatus according to claim 12, wherein stimulated echo components are extracted by subtracting echo signals collected during the second pre-scan from echo signals collected during the first pre-scan, and then calculating the phase correction amount based on the extracted signal.

15. The magnetic resonance imaging apparatus according to claim 1, wherein a plurality of echo signals are collected via a plurality of RF coil elements during the pre-scan, and the phase correction amount is calculated therefrom.

16. The magnetic resonance imaging apparatus according to claim 1, wherein a plurality of echo signals collected during a pre-scan, within a field of view specified in a readout direction by an operator, is used to calculate the phase correction amount.

17. The magnetic resonance imaging apparatus according to claim 1, wherein a plurality of echo signals collected during a pre-scan, from within a predetermined range, being compensated for at least a magnetostatic field unevenness and then the data within the predetermined range is used in order to calculate the phase correction amount.

18. A magnetic resonance imaging apparatus comprising:
MRI gantry components including static and gradient magnetic field generators, a plurality of radiofrequency (RF) coil elements coupled to an imaging volume, RF transmitter and RF receiver circuits coupled to said plurality of RF coil elements;
at least one processor; and
a memory that stores processor-executable instructions that, when executed by the at least one processor, cause the MRI gantry components to:
   execute a pre-scan that produces a plurality of sets of echoes in which a readout gradient magnetic field and a slice direction gradient magnetic field are applied in an identical manner to those to be used in a subsequent main-scan pulse sequence;
   add together a plurality of respectively corresponding echo signals in said sets of echoes that were collected via the plurality of coil elements during the pre-scan; and
   calculate a single phase correction amount that is then used in correcting phase differences which are present in a plurality of echo signals collected in the main-scan; and
   correct the main-scan pulse sequence based on the calculated phase correction amount.

19. A magnetic resonance imaging apparatus comprising:
MRI gantry components including static and gradient magnetic field generators, at least one radiofrequency (RF) coil coupled to an imaging volume, RF transmitter and RF receiver circuits coupled to said at least one RF coil;
at least one processor; and
a memory that stores processor-executable instructions that, when executed by the at least one processor, cause the MRI gantry components to:
   execute a pre-scan which produces a plurality of echoes in which a readout gradient magnetic field and a slice direction gradient magnetic field are applied in an identical manner to those that are used in a subsequent main-scan pulse sequence;
   use data collected from said plurality of echo signals within a field of view specified in a readout direction by an operator, in order to calculate a phase correction amount that is then used in correcting phase differences which are present in a plurality of echo signals collected in the main-scan; and
   correct the main-scan pulse sequence based on the calculated phase correction amount.

20. A magnetic resonance imaging apparatus comprising:
MRI gantry components including static and gradient magnetic field generators, at least one radiofrequency (RF) coil coupled to an imaging volume, RF transmitter and RF receiver circuits coupled to said at least one RF coil;
at least one processor; and
a memory that stores processor-executable instructions that, when executed by the at least one processor, cause the MRI gantry components to:
   execute a pre-scan which produces a plurality of echoes in which a readout gradient magnetic field and a slice direction gradient magnetic field are applied in an identical manner to a pulse sequence that is used in a subsequent main-scan;
   use data collected from said plurality of echo signals from within a predetermined range that is compensated for at least a magnetostatic field unevenness, in order to calculate a phase correction amount that is used in correcting phase differences present in a plurality of echo signals collected in the main-scan; and
   correct the main-scan pulse sequence based on the calculated phase correction amount.

* * * * *